(12) United States Patent
Zheng et al.

(10) Patent No.: US 12,279,511 B2
(45) Date of Patent: Apr. 15, 2025

(54) DISPLAY PANEL, MASK, MASK ASSEMBLY, AND METHOD OF MANUFACTURING MASK ASSEMBLY

(71) Applicants: Chengdu BOE Optoelectronics Technology Co., Ltd., Sichuan (CN); BOE Technology Group Co., Ltd., Beijing (CN)

(72) Inventors: Yong Zheng, Beijing (CN); Wenbiao Ding, Beijing (CN); Junxiu Dai, Beijing (CN); Chunyan Gao, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 1088 days.

(21) Appl. No.: 17/271,013

(22) PCT Filed: May 11, 2020

(86) PCT No.: PCT/CN2020/089601
§ 371 (c)(1),
(2) Date: Feb. 24, 2021

(87) PCT Pub. No.: WO2021/226788
PCT Pub. Date: Nov. 18, 2021

(65) Prior Publication Data
US 2022/0123068 A1 Apr. 21, 2022

(51) Int. Cl.
*H10K 59/88* (2023.01)
(52) U.S. Cl.
CPC .................. *H10K 59/88* (2023.02)

(58) Field of Classification Search
CPC .................. H10K 59/88; H10K 59/32
See application file for complete search history.

(56) References Cited

U.S. PATENT DOCUMENTS

| 2007/0052119 A1 | 3/2007 | Sakai et al. |
| 2014/0117385 A1 | 5/2014 | Park et al. |

(Continued)

FOREIGN PATENT DOCUMENTS

| CN | 108010953 A | 5/2018 |
| CN | 109309169 A | 2/2019 |

(Continued)

OTHER PUBLICATIONS

Extended European Search Report dated Jun. 1, 2023, issued in counterpart European Application No. 20897682.9. (9 pages).

(Continued)

*Primary Examiner* — Raj R Gupta
(74) *Attorney, Agent, or Firm* — WHDA, LLP

(57) ABSTRACT

A display panel, a mask used for evaporation, a mask assembly and a manufacturing method thereof are provided. The display panel includes: a base substrate; and a display area and a peripheral area; wherein, the peripheral area is provided with two types of dummy sub-pixel units, each type of dummy sub-pixel unit includes a dummy light-emitting material layer and a dummy auxiliary light-emitting layer, wherein, a first structure layer of a first dummy light-emitting material layer and a first dummy auxiliary light-emitting layer is arranged in the same layer as a second structure layer of a second dummy light-emitting material layer and a second dummy auxiliary light-emitting layer, and at least one of a size and a shape of an orthographic projection of the second structure layer on the base substrate is different from that of an orthographic projection of the first structure layer on the base substrate.

9 Claims, 13 Drawing Sheets

(56) References Cited

U.S. PATENT DOCUMENTS

2014/0306601 A1   10/2014  Kim et al.
2016/0093834 A1*  3/2016  Kim ...................... C23C 14/042
                                                                              118/504
2020/0176526 A1*  6/2020  Yoon ...................... H10K 59/88

FOREIGN PATENT DOCUMENTS

| CN | 109768066 A | 5/2019 |
| CN | 110718578 A | 1/2020 |
| CN | 111028692 A | 4/2020 |
| EP | 3142161 A1 | 3/2017 |
| EP | 3144996 A1 | 3/2017 |

OTHER PUBLICATIONS

International Search Report dated Jan. 27, 2021, issued in counterpart Application No. PCT/CN2020/089601. (5 pages).

* cited by examiner

A-A

DISPLAY PANEL, MASK, MASK ASSEMBLY, AND METHOD OF MANUFACTURING MASK ASSEMBLY

CROSS REFERENCE TO RELATED APPLICATIONS

This application is a National Stage Application of International Application No. PCT/CN2020/089601 filed on May 11, 2020, the whole disclosure of which is incorporated herein by reference.

TECHNICAL FIELD

The present disclosure relates to the field of display technology and mask technology, and in particular to a display panel, a mask, a mask assembly, and a method of manufacturing a mask assembly.

BACKGROUND

With the progress of display technology, Organic Light Emitting Diode (OLED) display device is one of the hot spots in the research field of flat panel display devices. In the manufacturing process of the organic light emitting diode device, it is often necessary to evaporate with a mask to form various patterned film layers, for example, to evaporate an organic light emitting layer with a mask.

Before using the mask to form the patterned film layers, the mask needs to be tensioned and welded on a mask frame to form a mask assembly. Before welding the mask on the mask frame, it is necessary to align the mask with the mask frame to prevent misalignment of the mask. Especially with the emergence of high-resolution OLED display panels, requirements on the alignment of the mask and the mask frame become higher. There is a need to provide a more efficient alignment scheme for the mask and the mask frame.

SUMMARY

Embodiments of the present disclosure provide a display panel, including: a base substrate; and a display area and a peripheral area arranged on the base substrate, the peripheral area being arranged around the display area; wherein, the peripheral area is provided with a plurality of dummy sub-pixel units including a first type of dummy sub-pixel unit and a second type of dummy sub-pixel unit; the first type of dummy sub-pixel unit includes a first dummy light-emitting material layer and a first dummy auxiliary light-emitting layer, and the second type of dummy sub-pixel unit includes a second dummy light-emitting material layer and a second dummy auxiliary light-emitting layer, the second dummy light-emitting material layer being made of the same material and arranged in the same layer as the first dummy light-emitting material layer, and the second dummy auxiliary light-emitting layer being made of the same material and arranged in the same layer as the first dummy auxiliary light-emitting layer; the first dummy auxiliary light-emitting layer is located on a side of the first dummy light-emitting material layer facing the base substrate and on a side of the base substrate facing the first dummy light-emitting material layer, and the second dummy auxiliary light-emitting layer is located on a side of the second dummy light-emitting material layer facing the base substrate and on a side of the base substrate facing the second dummy light-emitting material layer; an orthographic projection of the first dummy light-emitting material layer on the base substrate at least partially overlaps that of the first dummy auxiliary light-emitting layer on the base substrate, and an orthographic projection of the second dummy light-emitting material layer on the base substrate at least partially overlaps that of the second dummy auxiliary light-emitting layer on the base substrate; and wherein, a first structure layer of the first dummy light-emitting material layer and the first dummy auxiliary light-emitting layer is arranged in the same layer as a second structure layer of the second dummy light-emitting material layer and the second dummy auxiliary light-emitting layer, and at least one of a size and a shape of an orthographic projection of the second structure layer on the base substrate is different from that of an orthographic projection of the first structure layer on the base substrate.

In some embodiments, in at least one of a first direction and a second direction, a largest size of the orthographic projection of the second dummy light-emitting material layer on the base substrate is 15% to 30% greater than that of the orthographic projection of the first dummy light-emitting material layer on the base substrate.

In some embodiments, in at least one of the first direction and the second direction, the largest size of the orthographic projection of the second dummy auxiliary light-emitting layer on the base substrate is 15% to 30% greater than that of the orthographic projection of the first dummy auxiliary light-emitting layer on the base substrate, where the second direction is perpendicular to the first direction.

In some embodiments, the plurality of dummy sub-pixel units further includes a third type of dummy sub-pixel unit including a third dummy light-emitting material layer and a fourth type of dummy sub-pixel unit including a fourth dummy light-emitting material layer, and the third dummy light-emitting material layer and the fourth dummy light-emitting material layer are made of the same material which is different from a material of the first dummy light-emitting material layer and the second dummy light-emitting material layer; and at least one of a size and a shape of an orthographic projection of the fourth dummy light-emitting material layer on the base substrate is different from that of an orthographic projection of the third dummy light-emitting material layer on the base substrate.

In some embodiments, in at least one of the first direction and the second direction, the largest size of the orthographic projection of the fourth dummy light-emitting material layer on the base substrate is 15% to 30% greater than that of the orthographic projection of the third dummy light-emitting material layer on the base substrate, where the second direction is perpendicular to the first direction.

In some embodiments, in at least one of the first direction and the second direction, the size of the orthographic projection of the fourth dummy light-emitting material layer on the base substrate is different from that of the orthographic projection of the second dummy light-emitting material layer on the base substrate.

In some embodiments, the third type of dummy sub-pixel unit further includes a third dummy auxiliary light-emitting layer located on a side of the third dummy light-emitting material layer facing the base substrate and on a side of the base substrate facing the third dummy light-emitting material layer, and the fourth type of dummy sub-pixel unit further includes a fourth dummy auxiliary light-emitting layer located on a side of the fourth dummy light-emitting material layer facing the base substrate and on a side of the base substrate facing the fourth dummy light-emitting material layer; the fourth dummy auxiliary light-emitting layer is made of the same material as the third dummy auxiliary light-emitting layer; and at least one of a size and a shape of an orthographic projection of the fourth dummy auxiliary light-emitting layer on the base substrate is different from that of an orthographic projection of the third dummy auxiliary light-emitting layer on the base substrate.

In some embodiments, in at least one of the first direction and the second direction, the largest size of the orthographic projection of the fourth dummy auxiliary light-emitting layer on the base substrate is 15% to 30% greater than that of the orthographic projection of the third dummy auxiliary light-emitting layer on the substrate, where the second direction is perpendicular to the first direction.

In some embodiments, the display area includes a plurality of display sub-pixel units, at least one of the display sub-pixel units including: a first electrode, a display auxiliary light-emitting layer located on a side of the first electrode away from the base substrate, a display light-emitting material layer located on a side of the display auxiliary light-emitting layer away from the base substrate, and a second electrode located on a side of the display light-emitting material layer away from the base substrate, wherein, the plurality of display sub-pixel units include a display sub-pixel unit of a first color and a display sub-pixel unit of a second color, the display auxiliary light-emitting layer in the display sub-pixel unit of the first color is made of the same material and arranged in the same layer as the second dummy auxiliary light-emitting layer, and the display light-emitting material layer in the display sub-pixel unit of the first color is made of the same material and arranged in the same layer as the second dummy light-emitting material layer; and the display auxiliary light-emitting layer in the display sub-pixel unit of the second color is made of the same material and arranged in the same layer as the fourth dummy auxiliary light-emitting layer, and the display light-emitting material layer in the display sub-pixel unit of the second color is made of the same material and arranged in the same layer as the fourth dummy light-emitting material layer.

In some embodiments, an orthographic projection of at least one of the second dummy light-emitting material layer, the second dummy auxiliary light-emitting layer, the fourth dummy light-emitting layer and the fourth dummy auxiliary light-emitting layer on the base substrate has an axisymmetric shape.

In some embodiments, at least one of the first type of dummy sub-pixel unit and the second type of dummy sub-pixel unit further includes: a first electrode located on a side of the base substrate facing the first and second dummy auxiliary light-emitting layers; a pixel defining layer located on a side of the first electrode away from the base substrate and on a side of the first and second dummy auxiliary light-emitting layers facing the base substrate; and a second electrode located on a side of the first and second dummy light-emitting material layers away from the base substrate the pixel defining layer separates the first electrode from the first and second dummy auxiliary light-emitting layers.

The embodiments of the present disclosure further provide a mask used for evaporation, including: a mask pattern area including one or more sets of evaporation patterns, wherein at least one set of evaporation patterns includes: a display pattern area provided with a display pixel opening configured to evaporate a film layer in a sub-pixel structure of the display panel; and a peripheral pattern area located in a periphery of the display pattern area, wherein the peripheral pattern area is provided with a positioning opening configured to position the mask and is further provided with a dummy pixel opening configured to evaporate a film layer in a dummy sub-pixel structure of the display panel, wherein at least one of a size and a shape of the positioning opening is different from that of the display pixel opening and the dummy pixel opening.

In some embodiments, in at least one of the first direction and the second direction, a largest size of the positioning opening is greater than that of the display pixel opening and the dummy pixel opening, wherein the second direction is perpendicular to the first direction.

In some embodiments, in at least one of the first direction and the second direction, the largest size of the positioning opening is 15% to 30% greater than that of the display pixel opening and the dummy pixel opening.

In some embodiments, the peripheral pattern area is provided with a plurality of positioning openings distributed symmetrically with respect to a center of the display pattern area.

In some embodiments, the plurality of positioning openings include a first positioning opening, a second positioning opening, a third positioning opening and a fourth positioning opening respectively located at four corners of the mask pattern area of the mask.

In some embodiments, the mask further including a fixing area located around the mask pattern area and a thickness transition area located between the fixing area and the mask pattern area, wherein the fixing area is configured to be fixed to a mask frame, and the fixing area has a thickness greater than that of the mask pattern area.

The embodiments of the present disclosure further provide a mask assembly, including: one or more masks described in any of the above-mentioned embodiments; and a mask frame configured to support and fix the mask, wherein the mask further includes a fixing area located around the mask pattern area and fixed to the mask frame.

In some embodiments, the mask assembly includes a plurality of masks, the mask pattern area of at least one of the masks includes a plurality of sets of evaporation patterns, and a spacing area is provided between adjacent two sets of the evaporation patterns; the mask assembly further includes: at least one support bar configured to support the mask, wherein an orthographic projection of the support bar on the mask falls within the spacing area of the mask; and at least one cover strip located at a boundary of adjacent masks and configured to cover a gap between the adjacent masks.

The embodiments of the present disclosure further provide a method of manufacturing a mask assembly, including: performing a preliminary alignment of a mask and a mask frame by using a positioning opening of the mask; performing a precise alignment of the mask and the mask frame by using a display pixel opening or a dummy pixel opening of the mask after the preliminary alignment is successful; and fixing the mask to the mask assembly after the precise alignment is performed.

In some embodiments, the performing a preliminary alignment of a mask and a mask frame by using a positioning opening of the mask includes: providing a reference position of the positioning opening of the mask relative to the mask frame; capturing an actual position of the positioning opening of the mask relative to the mask frame; and calculating an error between the reference position and the actual position, determining whether an alignment of the mask and the mask frame is successful based on the error, and determining that the alignment is successful if the error is below a first threshold, or adjusting the actual position of the mask to further perform the alignment if the error is not below the first threshold.

In some embodiments, the performing a precise alignment of the mask and the mask frame by using a display pixel opening or a dummy pixel opening of the mask includes: providing a reference position of a predetermined display pixel opening or dummy pixel opening of the mask relative to the mask frame; capturing an actual position of the predetermined display pixel opening or dummy pixel opening of the mask relative to the mask frame; calculating an error between the reference position and the actual position of the predetermined display pixel opening or dummy pixel opening relative to the mask frame to determine whether the alignment of the mask and the mask frame is successful based on the error, and determining that the alignment is successful if the error is below a second threshold range, or re-adjusting the actual position of the mask to further perform the alignment if the error is not below the second threshold, wherein the second threshold is less than the first threshold.

BRIEF DESCRIPTION OF THE DRAWINGS

By reading the detailed description of the non-limiting embodiments with reference to the following drawings, other features, objectives and advantages of the present disclosure will become more apparent.

FIG. 1C shows a schematic diagram of a light-emitting element film layer structure of a sub-pixel unit in the display area of the OLED display panel shown in

FIG. 1A;

DETAILED DESCRIPTION

Figure 1A:
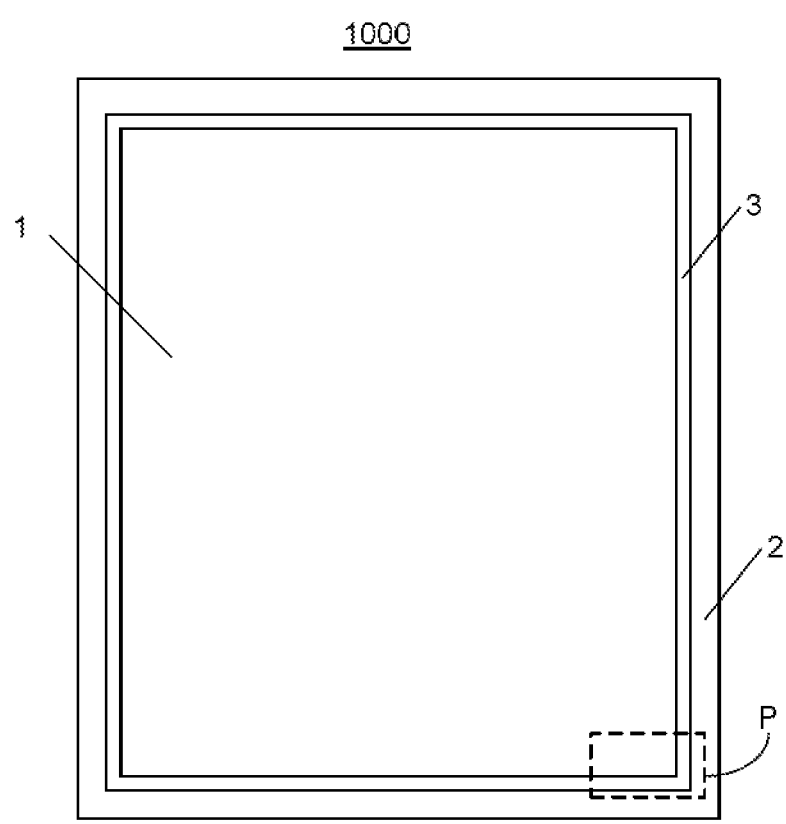
FIG. 1A shows a schematic diagram of an OLED display panel.

The present disclosure will be further described in detail below with reference to the drawings and embodiments. It may be understood that the specific embodiments described here are only used to explain the related invention, but not to limit the present disclosure. In addition, it should be noted that, for ease of description, only the parts related to the present disclosure are shown in the drawings.

It should be noted that, in the case of no conflict, the embodiments in the present disclosure and the features in the embodiments may be combined with each other.

In addition, in the following detailed description, for the convenience of explanation, many specific details are set forth to provide a comprehensive understanding of the embodiments of the present disclosure. Obviously, however, one or more embodiments may also be implemented without these specific details.

It should be understood that, although the terms "first," "second," and so on may be used herein to describe different elements, these elements should not be limited by these terms. These terms are only used to distinguish one element from another. For example, without departing from the scope of exemplary embodiments, a first element may be named as a second element, and similarly, the second element may be named as the first element. The term "and/or" as used here includes any and all combinations of one or more related listed items.

It should be understood that when an element or layer is referred to as being "formed on" another element or layer, the element or layer may be directly or indirectly formed on the other element or layer. That is, for example, an intermediate element or an intermediate layer may be present. In contrast, when an element or layer is referred to as being "directly formed on" another element or layer, no intermediate elements or layers are present. Other terms used to describe the relationship between elements or layers (for example, "between" and "directly between", "adjacent to" and "directly adjacent to", etc.) should be interpreted in a similar manner.

The terms used herein are only for the purpose of describing specific embodiments, and are not intended to limit the embodiments. As used herein, unless otherwise specified in the context, a singular form is also intended to include a plural form. It should also be understood that when the terms "comprising" and/or "including" are used herein, it means that the described features, wholes, steps, operations, elements and/or components are present, but do not exclude the presence or addition of one or more other features, wholes, steps, operations, elements, components and/or combinations thereof.

In the present disclosure, unless otherwise specified, the expressions "located in the same layer" and "arranged in the same layer" generally mean that a first component and a second component may be formed of the same material and may be formed by the same patterning process. The expressions "located in different layers" and "arranged in different layers" generally indicate that the first component and the second component are formed by different patterning processes.

Figure 1B:
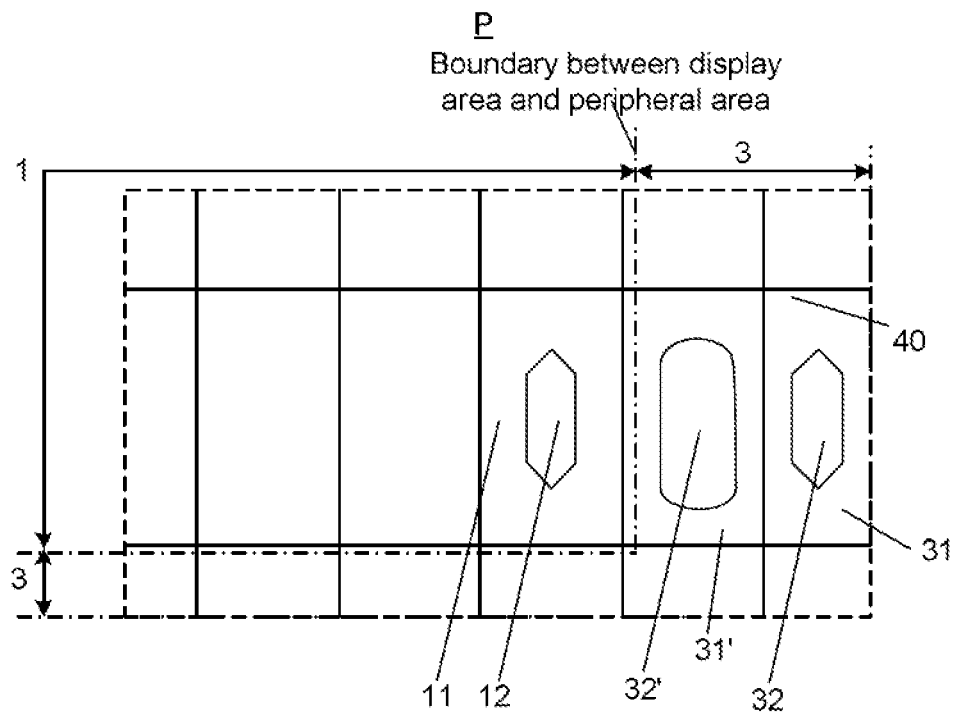
FIG. 1B shows a schematic enlarged diagram of a boundary area P between a display area and a peripheral area of the OLED display panel shown in FIG. 1A.

FIG. 1A schematically shows an OLED display panel 1000, including a display area 1 and a peripheral area 2 surrounding the display area 1. The peripheral area 2 may be arranged, for example, around the display area 1. The display area 1 is provided with a plurality of sub-pixel units, each sub-pixel unit including a light-emitting structure and a pixel driving circuit. The light-emitting structure includes, for example, a cathode, an anode, and a light-emitting functional layer located between the cathode and the anode. The light-emitting functional layer may include, for example, an organic light-emitting layer, a hole transport layer (between the organic light-emitting layer and the anode), and an electron transport layer (between the organic light-emitting layer and the cathode). The pixel driving circuit may include, for example, electronic devices such as a thin film transistor, a storage capacitor, and so on. The peripheral area 2 is mainly used for wiring and a layout of some peripheral electronic devices (such as driver IC (integrated circuit), etc.). However, in order to prevent the sub-pixel units in the display area 1 close to the peripheral area 2 from being affected by the peripheral area 2, a transition area 3 is provided in a region of the peripheral area 2 adjacent to the display area 1. Some dummy sub-pixel units 31 may be arranged in the transition area 3. FIG. 1B shows an enlarged view of a boundary area P between the display area 1 and the peripheral area 2. A display sub-pixel unit 11 in the display area 1 and a dummy sub-pixel unit in the transition area 3 are shown in FIG. 1B. An arrangement of the dummy sub-pixel unit may provide the display sub-pixel unit 11 in the display area 1 close to the peripheral area 2 with an environment similar to that of the display sub-pixel unit 11 in the display area 1 far away from the peripheral area 2, thereby avoiding differences in display brightness of different display sub-pixel units 11.

An organic light-emitting layer in the OLED display panel is a necessary structure in the film layer structure for achieving light emission. When the display panel is operating, the organic light-emitting layer may be excited to emit light by controlling a voltage applied to the anode and the cathode. The organic light-emitting layer may be produced, for example, by evaporation. In the process of evaporation of the organic light-emitting layer, a mask (or referred to as a fine metal mask (FMM)) assembly is needed. The mask assembly generally includes a mask and a mask frame for holding the mask. The mask is usually fixed to the mask frame by welding.

Figure 2:
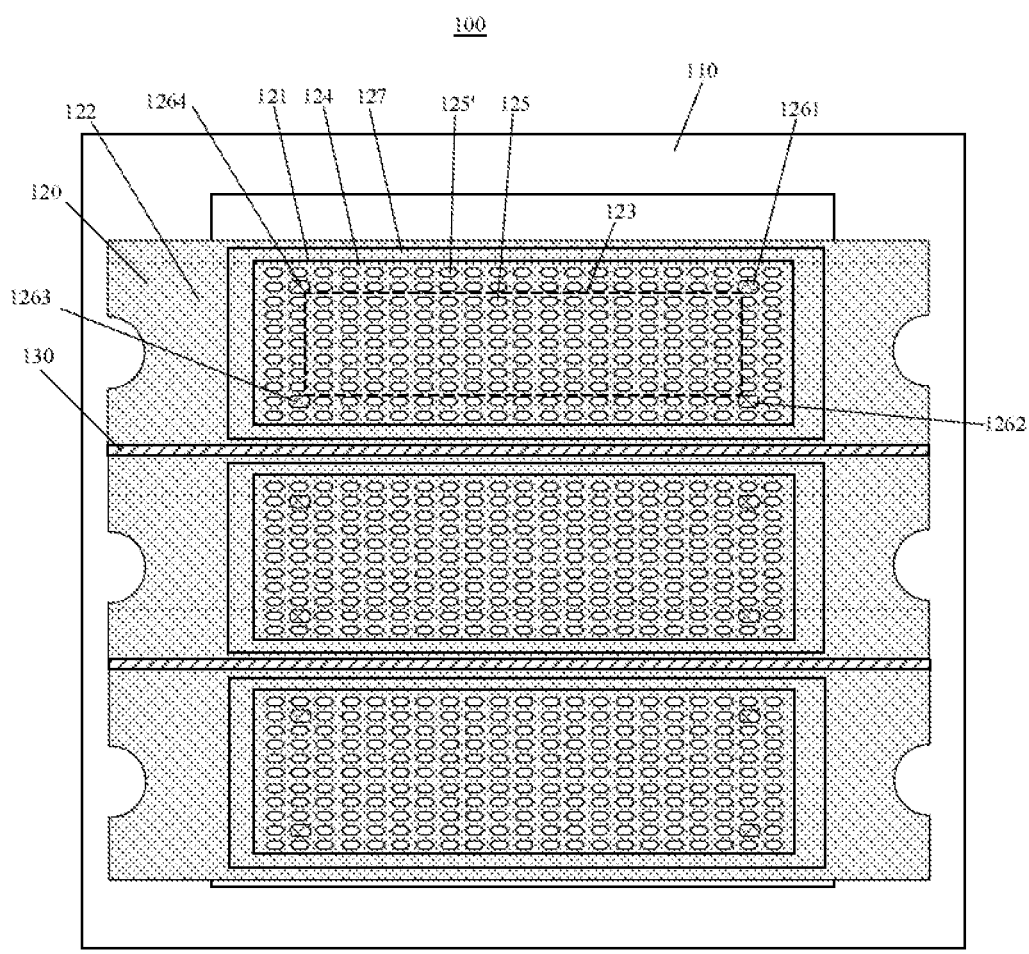
FIG. 2 shows a schematic diagram of a mask assembly according to some embodiments of the present disclosure.
Figure 9A:
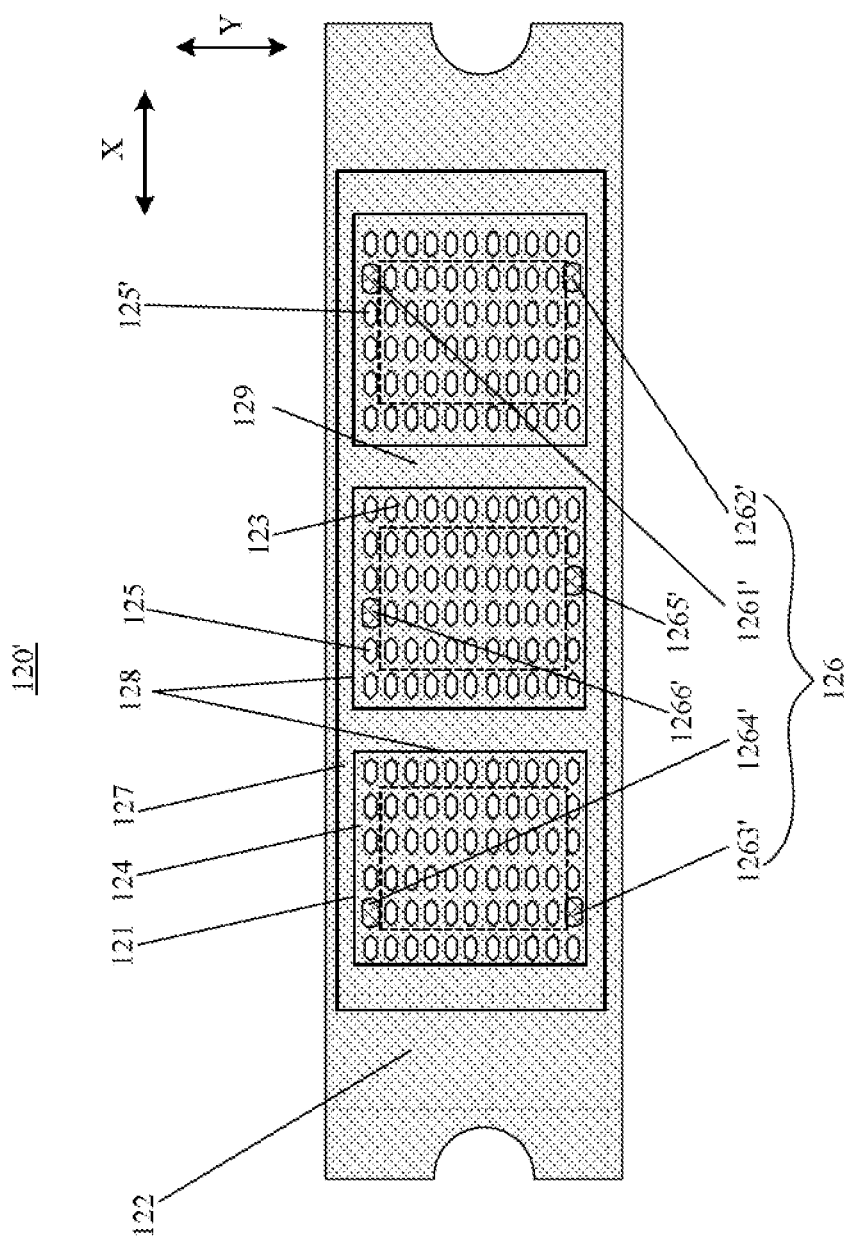
FIG. 9A shows a schematic diagram of a mask according to some other embodiments of the present disclosure.
Figure 9B:
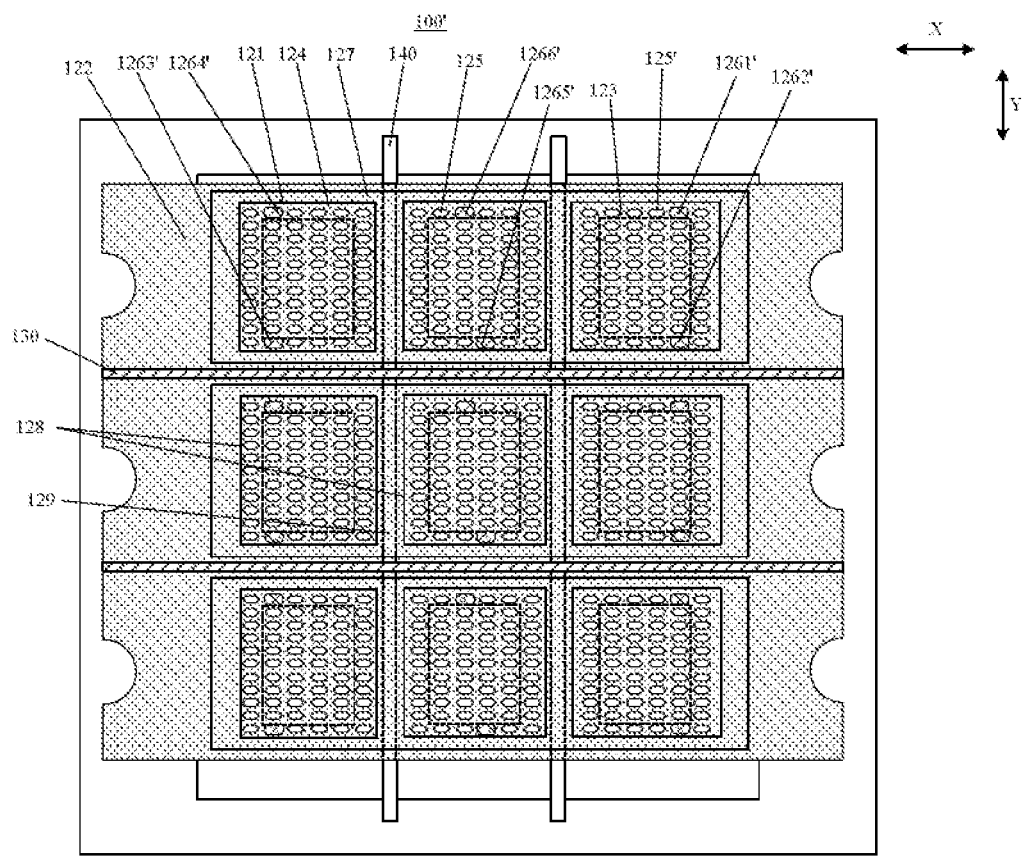
FIG. 9B shows a schematic diagram of a mask assembly according to some other embodiments of the present disclosure.

FIG. 2 shows a mask assembly 100 according to some embodiments of the present disclosure. The mask assembly 100 includes a mask frame 110 and three masks 120 fixed on the mask frame 110. It should be noted that the number of the masks 120 shown in FIG. 2 is only exemplary, and the embodiments of the present disclosure are not limited thereto. For example, the mask assembly 100 may include one mask 120, two masks 120, or four or more masks 120. The mask assembly 100 may further include a cover strip 130. The cover strip 130 is located on a side of the mask away from the mask frame 110 and configured to cover a gap between adjacent masks 120, so as to prevent an evaporation material from reaching the substrate to be coated through the gap between adjacent masks during the evaporation. A plurality of masks 120 located on the same mask frame 110 may be arranged side by side. In the example of FIG. 2, only one set of evaporation patterns is provided on each mask 120, that is, the patterns on the entire mask 120 are only used to evaporate the patterns on one display panel. However, the embodiments of the present disclosure are not limited thereto. For example, for a mask 120' as shown in FIGS. 9A and 9B, multiple sets of evaporation patterns 128 may be provided on the mask 120'. Each set of evaporation patterns 128 corresponds to a display panel, that is to say, with such a mask 120', the evaporation operation may be performed on film layer structures on multiple display panels at the same time. As shown in FIG. 9B, the mask assembly 100' may further include one or more support bars 140 for supporting the mask 120'. An orthographic projection of the support bar 140 on the mask 120' falls within a spacing area 129 of the mask 120'. The spacing area 129 is located between adjacent evaporation patterns 128 to separate the adjacent evaporation patterns 128. The support bar 140 and the cover strip 130 may be formed separately or integrally.

Figure 3A:
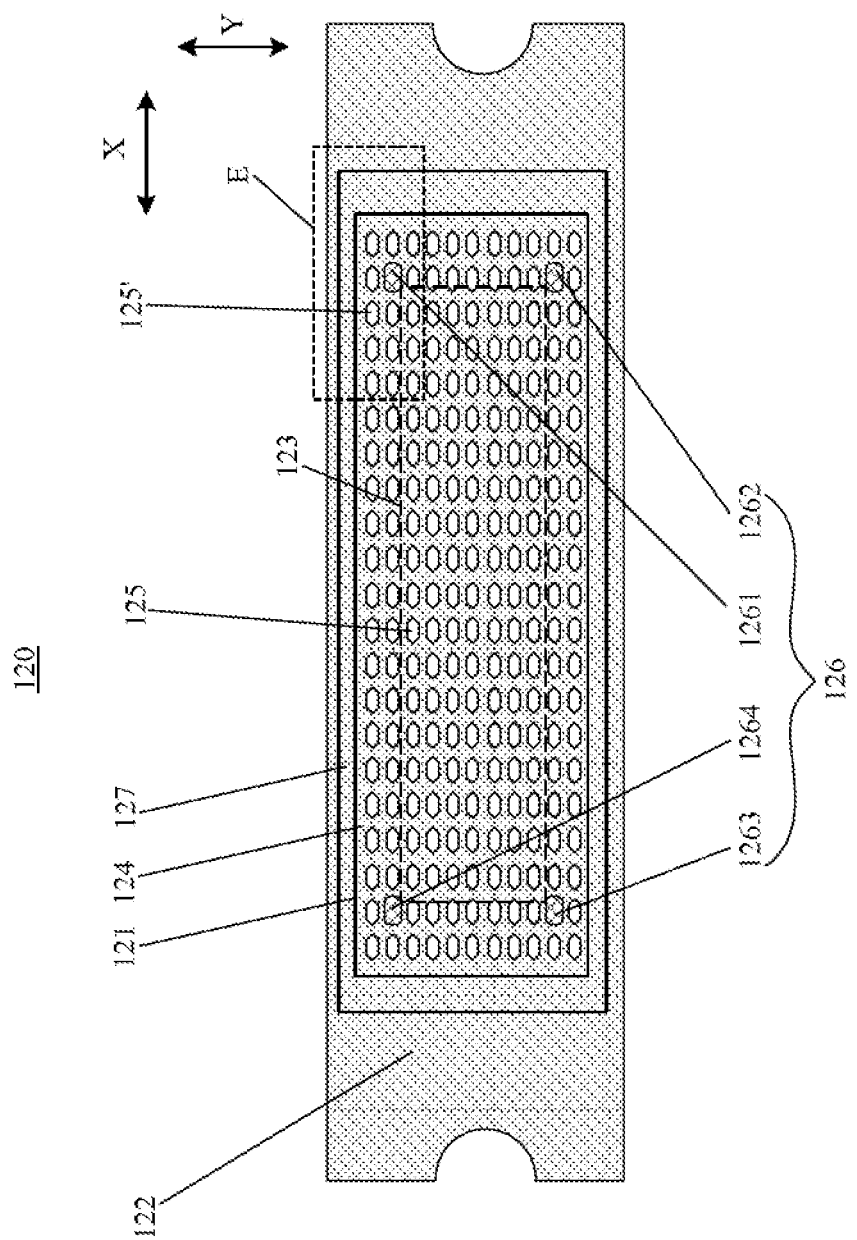
FIG. 3A shows a schematic diagram of a mask according to some embodiments of the present disclosure.

FIG. 3A shows the mask 120 according to some embodiments of the present disclosure. The mask 120 includes a mask pattern area 121 and a fixing area 122. The fixing area 122 is used to be fixed to the mask frame 110, for example, by welding. The fixing area 122 is located at a periphery of the mask pattern area 121. In order to facilitate the fixing operation (for example, welding operation), the fixing area 122 may have a thickness greater than that of the mask pattern area 121. The mask pattern area 121 includes a display pattern area 123 (represented by a dashed box in FIG. 3A) and a peripheral pattern area 124. The display pattern area 123 is provided with a plurality of display pixel openings 125 (which may be arranged in an array, for example) used to evaporate a film layer (such as an organic light-emitting layer) in a display sub-pixel structure of the display panel. The so-called display sub-pixel structure refers to a sub-pixel structure located in the display area of the display panel for generating image pixels, which may include, for example, a light-emitting structure. The peripheral pattern area 124 is located in the periphery of the display pattern area 123. In the example shown in FIG. 3A, the peripheral pattern area 124 is arranged to surround the display pattern area 123. The peripheral pattern area 124 is provided with positioning openings 126. In the process of manufacturing the mask assembly 100, 100', before fixing the mask 120 to the mask frame 110, the mask 120 needs to be positioned relative to the mask frame 110, so as to ensure that during the evaporation, the display pixel openings 125 of the mask 120 are aligned with correct portions of the substrate 200 to be coated. In the case where multiple sets of evaporation patterns 128 are provided on the mask, each set of evaporation patterns 128 may include, for example, the display pattern area 123 and the peripheral pattern area 124.

Figure 8:
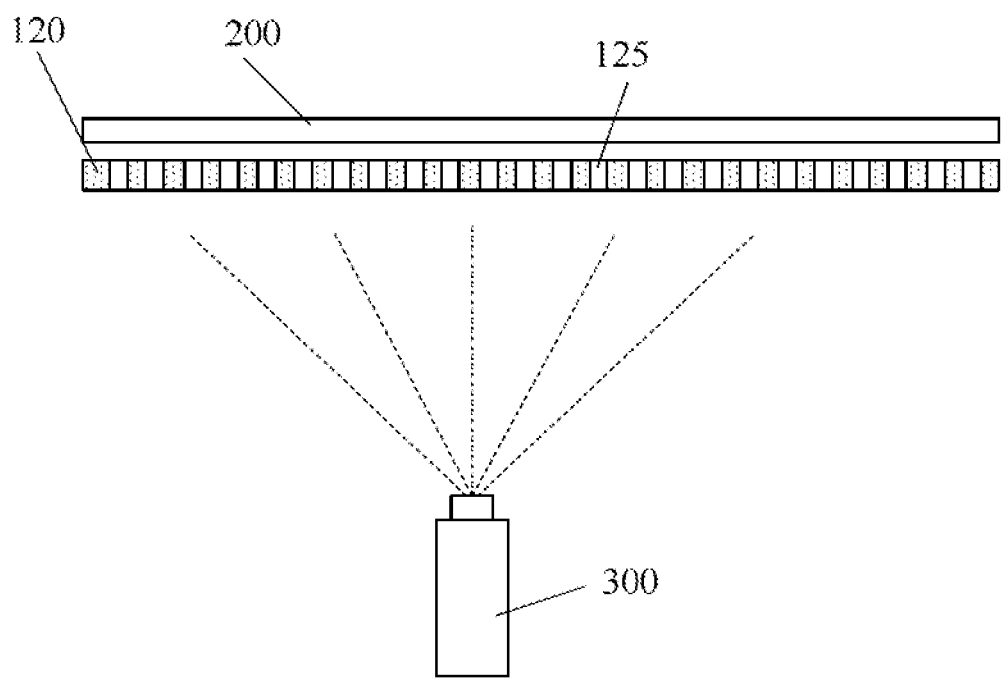
FIG. 8 shows a schematic diagram of evaporating a film layer on a substrate to be coated by using the mask assembly.

FIG. 8 schematically shows a process of evaporating a film layer on the substrate 200 by using the mask assembly 100, 100'. As shown, during the evaporation process, the mask assembly 100, 100' is placed between an evaporation source 300 and the substrate 200 to be coated. An organic evaporation material from the evaporation source 300 may pass through the pixel openings 125 to corresponding portions of the substrate 200, and portions of the substrate 200 corresponding to unopened portions of the mask 120 are not coated with the organic material or coated with a small amount of organic material since the organic evaporation material is blocked by the mask 120. In this way, a desired organic film layer structure may be formed on the substrate 200. If relative positions of the mask 120 and the mask frame 110 are misaligned, a positioning error between the display pixel openings 125 of the mask 120 and the correct position on the substrate 200 may be generated, resulting in a decrease in product yield.

Figure 5:
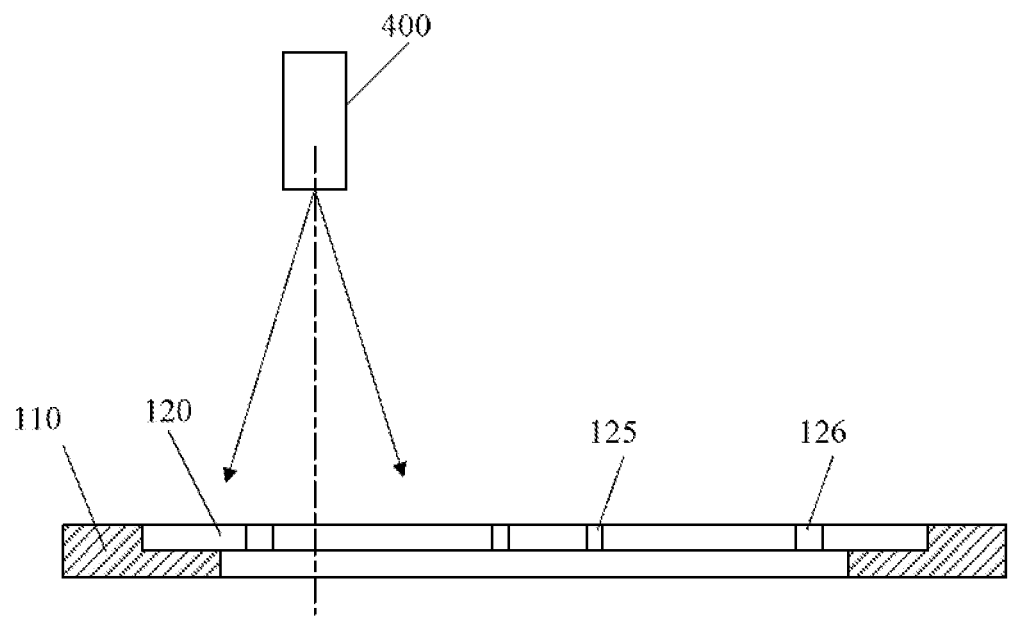
FIG. 5 schematically shows an alignment operation of the mask and the mask frame during the formation of the mask assembly.

FIG. 5 shows a process of aligning the mask 120 with respect to the mask frame 110 according to some embodiments of the present disclosure. Before the alignment operation is performed, the mask frame 110 is first fixed, and a reference coordinate system is established according to the mask frame 110, then coordinates of a desired position (or referred to as a reference position) of the positioning opening 126 of the mask 120 in the reference coordinate system is determined (for example, the coordinates of the reference position are (x0, y0)). After the mask 120 is loaded, coordinates of an actual position of the positioning opening 126 of the mask 120 in the reference coordinate system is determined (for example, the coordinates of the actual position are (x, y)) by a position capturer (such as a camera) 400. Then, an error between the coordinates (x0, y0) of the reference position of the positioning opening 126 and the coordinates (x, y) of the actual position is calculated, and the position of the mask 120 relative to the mask frame 110 is adjusted according to the error to gradually reduce the error until the error is below a certain threshold. For example, when either of an absolute value or square of (x−x0) and that of (y−y0) is less than a certain threshold, it may be determined that the alignment is successful. In some embodiments of the present disclosure, a reference position of a center of the positioning opening 126 may act as the reference position of the positioning opening 126, and an actual position of the center of the positioning opening 126 may act as the actual position of the positioning opening 126. In some embodiments, at least one of the position capturer (such as a camera) 400 and the mask 120 is movable (such as horizontally movable) to facilitate the capture of the positioning opening 126. FIG. 5 only schematically shows a few positioning openings 126 and display pixel openings 125.

For a display panel with a low resolution and a large size, it is possible to directly select some display pixel openings 125 for alignment. In other words, shape and size of the positioning openings 126 do not require special design. However, for a high-resolution display panel, there may be problems if the display pixel openings 125 are directly used for the alignment of the mask 120 and the mask frame 110. The higher the resolution of the OLED display panel, the smaller the required size of the organic light-emitting layer in the sub-pixel unit, and the smaller the size of the display pixel opening 125 of the corresponding mask 120. For example, the size of the display pixel opening 125 of the mask 120 with a resolution of 500 PPI is approximately 35 um*60 um, and the size of the display pixel opening 125 of the mask 120 with a resolution of 1000 PPI is approximately 15 um*35 um. As described above, during the alignment of the mask 120 and the mask frame 110, the position of the opening of the mask 120 is captured by the position capturer (for example, a camera) 400. The camera has a constant field of view. When the openings have small sizes and are distributed more densely, the number of openings in the same field of view of the camera will increase significantly. In this case, if the size and shape of the positioning opening 126 and those of the display pixel opening 125 are not designed differently, when the camera performs a quick scanning, there may be errors in capturing the target of the openings, which will affect an efficiency of the alignment operation.

Figure 3B:
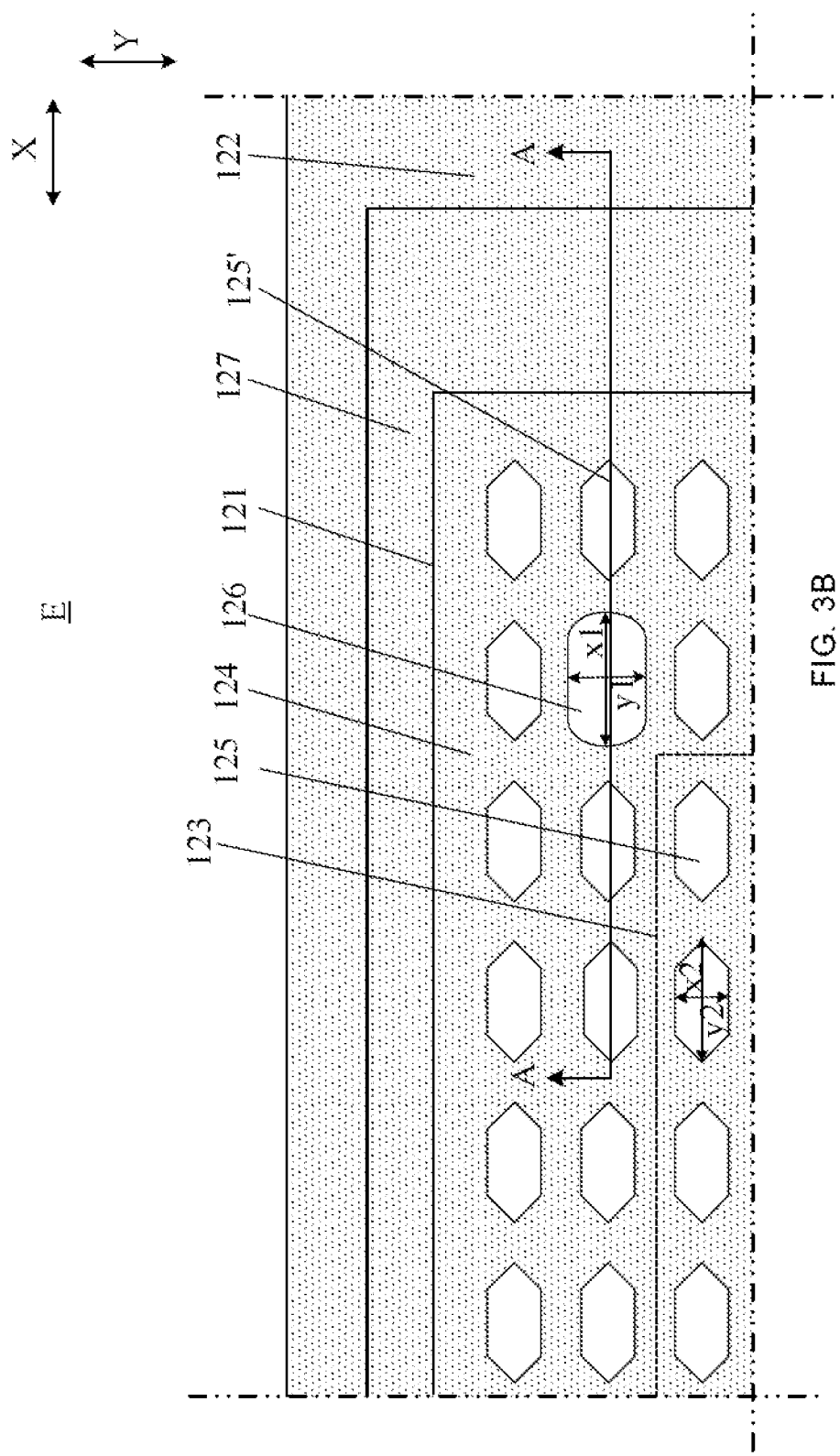
FIG. 3B shows an schematic enlarged diagram of part E in FIG. 3A.

Therefore, in the embodiments of the present disclosure, the positioning opening 126 is designed to have a certain difference in shape and/or size from the display pixel opening 125. In other words, at least one of the size and shape of the positioning opening 126 is different from that of the display pixel opening 125. For example, in the examples shown in FIGS. 3A and 3B, the display pixel opening 125 has a hexagonal shape. The display pixel opening 125 has a largest size x2 in a first direction (that is, direction X in FIG. 3B) and a largest size y2 in a second direction (that is, direction Y in FIG. 3B). The positioning opening 126 has an obround shape. The positioning opening 126 has a largest size x1 in the first direction (that is, the direction X in FIG. 3B) and a largest size y1 in the second direction (that is, the direction Y in FIG. 3B), where x1 is greater than x2, and y1 is greater than y2. From the perspective of facilitating the alignment operation, it is advantageous that the size of the positioning opening 126 is greater than that of the display pixel opening 125. This may make it easier for the position capturer 400 to capture the position of the positioning opening 126, thereby improving the alignment efficiency. If the largest size of the positioning opening 126 is not much different from that of the display pixel opening 125, a discrimination between the positioning opening 126 and the display pixel opening 125 is not good, which is not conducive to the alignment of the mask and the mask frame. If the largest size of the positioning opening 126 is too much greater than that of the display pixel opening 125, a local strength of the mask may be damaged. In some embodiments, the largest size of the positioning opening 126 in the first direction is 15% to 30% greater than that of the display pixel opening 125. In some embodiments, the largest size of the positioning opening 126 in the second direction is 15% to 30% greater than that of the display pixel opening 125. However, this is not necessary. For example, in some embodiments, each of the largest sizes of the positioning opening 126 in the first direction and the second direction may be smaller than the corresponding size of the display pixel opening 125. Alternatively, one of the largest sizes of the positioning opening 126 in the first direction and the second direction is greater than the corresponding size of the display pixel opening 125, and the other is smaller than the corresponding size of the display pixel opening 125, as long as the difference between the positioning opening 126 and the display pixel opening 125 is sufficient to enable the position capturer 400 to capture the position of the positioning opening 126 more quickly and accurately. In some embodiments, the positioning opening 126 may have an axisymmetric shape, so that stress near the positioning opening 126 may be evenly distributed.

Figure 7A:
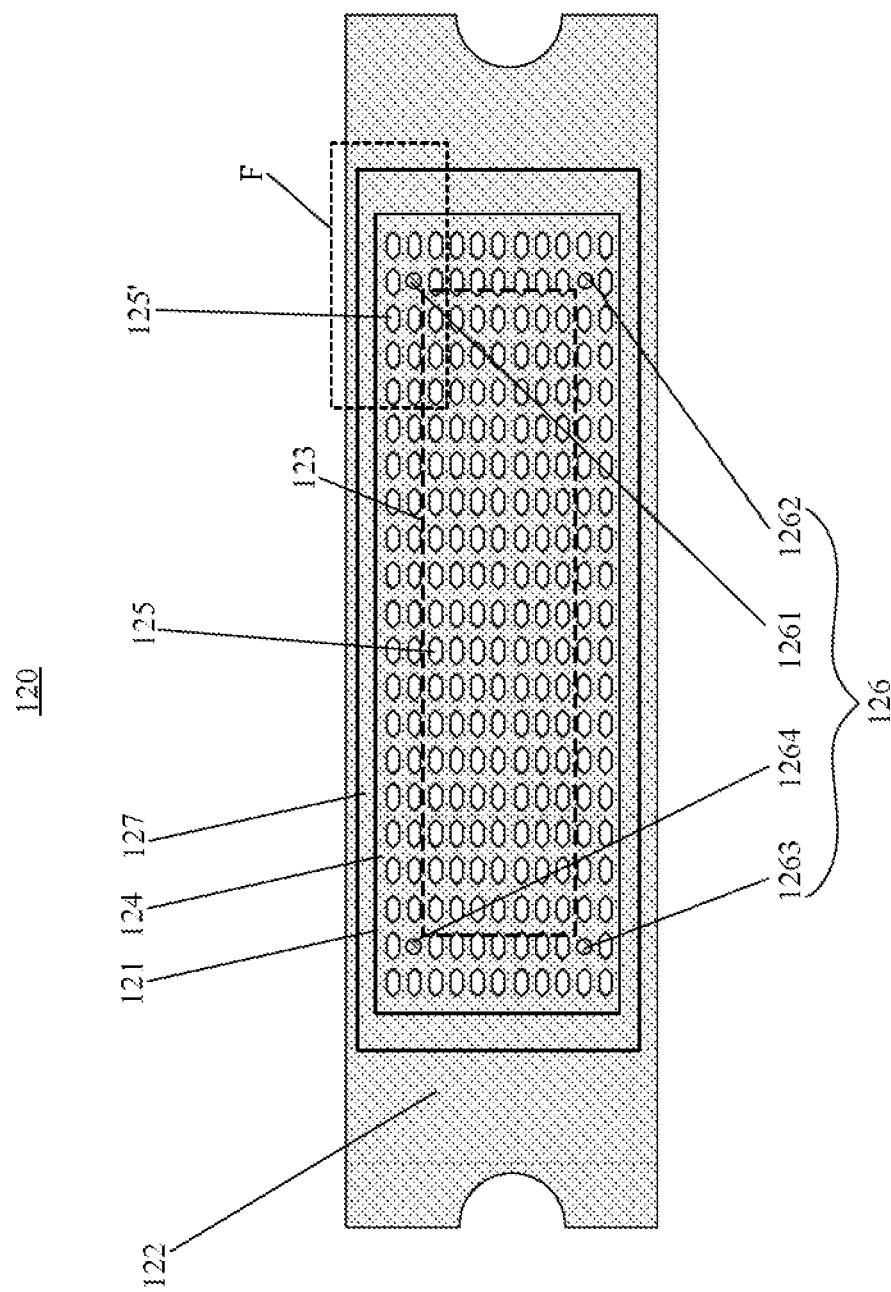
FIG. 7A shows a schematic diagram of a mask according to some other embodiments of the present disclosure.
Figure 7B:
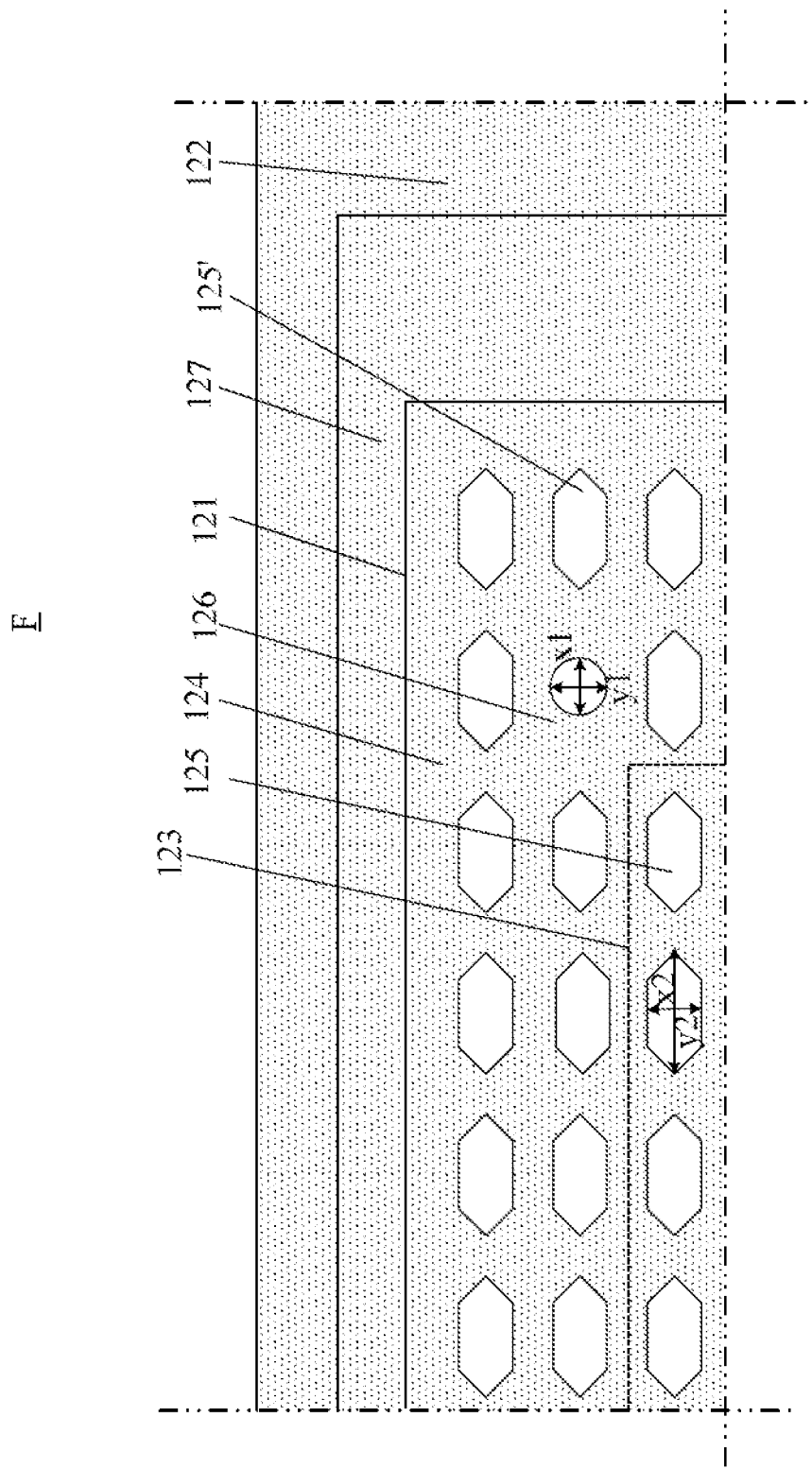
FIG. 7B is a schematic enlarged diagram of part F in FIG. 7A.

In another embodiment, the positioning opening 126 may have a more distinct shape from the display pixel opening 125. For example, as shown in FIGS. 7A and 7B, the positioning opening 126 may have a circular shape. The shapes of the positioning opening 126 shown in FIGS. 3A, 3B, 7A and 7B are only illustrative, and the embodiments of the present disclosure are not limited thereto. For example, it may have various shapes such as ellipse, rectangle, hexagon, and so on.

As mentioned above, the display sub-pixel unit 11 is provided in the display area 1 of the OLED display panel, and the dummy sub-pixel unit 31 is provided in the transition area 3 in the peripheral area 2 of the OLED display panel close to the display area 1. Therefore, the display pattern area 123 of the mask 100 according to the embodiments of the present disclosure corresponds to the display area 1 of the OLED display panel, and the display pixel openings 125 located in the display pattern area 123 may be used to achieve, for example, an evaporation of a light-emitting material layer in the display sub-pixel unit 11 (a position of a light-emitting material layer 12 in the display sub-pixel unit 11 is schematically shown in FIG. 1B). Accordingly, the peripheral pattern area 124 of the mask 100 according to the embodiments of the present disclosure corresponds to the peripheral area 2 of the OLED display panel. Due to the production requirements of the dummy sub-pixel unit 31, a dummy pixel opening 125' may be further provided in the peripheral pattern area 124, and a position of the dummy pixel opening 125' may correspond to the dummy sub-pixel unit 31 in the peripheral area 2. The dummy pixel opening 125' may be used to achieve, for example, an evaporation of a light-emitting material layer in the dummy sub-pixel unit 31 (a position of a light-emitting material layer 32 in the dummy sub-pixel unit 31 is also schematically shown in FIG. 1B). As an example, the dummy pixel opening 125' added in the peripheral pattern area 124 may have the same size and shape as the dummy pixel opening 125 in the display pattern area 123.

Since the peripheral pattern area 124 does not correspond to the display area 1 of the display panel, the positioning opening 126 may be arranged in the peripheral pattern area 124 to avoid affecting the production of the display sub-pixel unit 11. For the convenience of production, the positioning opening 126 may be implemented by replacing the original dummy pixel opening 125', or produced by changing the shape and size of some dummy pixel openings 125'. In some embodiments, a plurality of positioning openings 126 may be provided in the peripheral pattern area 124. These positioning openings 126 may be symmetrically distributed with respect to a center of the display pattern area 123, which may make the stress distribution of the mask 120 more uniform. For example, the plurality of positioning openings 126 may include a first positioning opening 1261, a second positioning opening 1262, a third positioning opening 1263, and a fourth positioning opening 1264 respectively located at four corners of the mask pattern area 121 of the mask 120. In some embodiments, each of the positioning openings 126 may be surrounded by the dummy pixel opening 125'. In the case where multiple sets of evaporation patterns 128 are provided on the mask 120', a first positioning opening 1261', a second positioning opening 1262', a third positioning opening 1263' and a fourth positioning opening 1264' may also be provided at four corners of the entire mask pattern area 121 of the mask 120', as shown in FIG. 9A. Moreover, positioning openings such as a fifth positioning opening 1265' and a sixth positioning opening 1266' may be added in other positions of the mask pattern area 121. These positioning openings may also be located at corners of a certain set of evaporation patterns 128 (that is, a position near an intersection of the support bar 140 and the cover strip 130).

Considering the difference between the positioning opening 126 and the display pixel opening 125 (and the dummy pixel opening 125') in shape and size, the positioning opening 126 is not suitable to be provided in the display pattern area 123. However, in some cases, it is also desirable to position with the openings in the display pattern area 123 to ensure positioning accuracy. Accordingly, the embodiments of the present disclosure further provide a method of aligning the mask and the mask frame. The method may be used in a manufacturing process of the mask assembly. After the positioning opening 126 is provided on the mask 120, a preliminary alignment of a position of the mask 120 relative to the mask frame 110 may be performed first by means of the positioning openings 126 provided in the peripheral pattern area 124 of the mask 120, and then a precise alignment of the position of the mask 120 relative to the mask frame 110 may be performed by means of the display pixel openings 125 provided in the display pattern area 123 of the mask 120. In the preliminary alignment operation, the position capturer (such as a camera) 400 may more easily capture the positioning openings 126 of the mask 120 so as to improve the alignment efficiency, and the precise alignment performed with the display pixel openings 125 on the basis of the preliminary alignment may ensure the accuracy. Compared with directly using the display pixel openings 125 to align the mask 120 and the mask frame 110, the alignment efficiency may be greatly improved, and manual adjustment in the alignment process may be effectively reduced.

Figure 6:
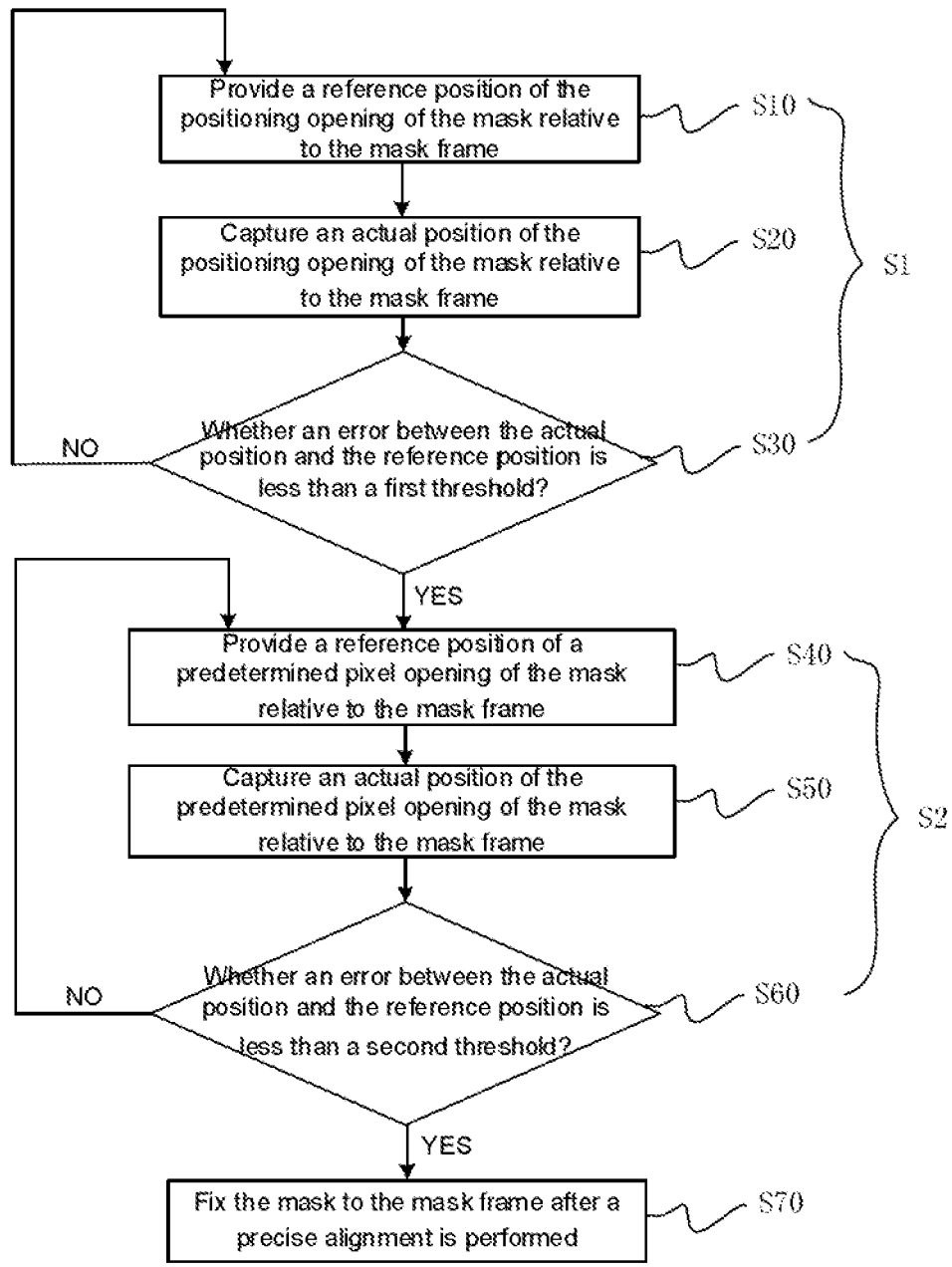
FIG. 6 schematically shows a flowchart of a method of manufacturing a mask assembly according to some embodiments of the present disclosure.

A method of manufacturing the mask assembly in which the above-mentioned alignment method is used is shown in FIG. 6, for example. The method of manufacturing the mask assembly may include:

Step S1: Perform a preliminary alignment of the mask and the mask frame by using the positioning openings of the mask; and Step S2: Perform a precise alignment of the mask and the mask frame by using the display pixel openings of the mask after the preliminary alignment is successful.

The step S1 may further include, for example:

Step S10: Provide a reference position of the positioning opening of the mask relative to the mask frame;

Step S20: Capture an actual position of the positioning opening of the mask relative to the mask frame;

Step S30: Calculate an error between the reference position and the actual position to determine whether the alignment of the mask and the mask frame is successful based on the error, and determine that the alignment is successful if the error is below a first threshold, or adjust the actual position of the mask to further perform the alignment if the error is not below the first threshold.

In the step S20, the actual position of the positioning opening 126 may be captured by using the position capturer (such as a camera) 400, for example, by an image processing method. For example, an edge of the positioning opening 126 may be acquired first and the sizes of the positioning opening 126 in the first direction and the second direction may be calculated so as to determine that the positioning opening 126 is correctly captured. Then the center of the positioning opening 126 is further identified to determine the coordinates of the actual position of the positioning opening 126 relative to the mask frame 110.

For example, the coordinates of the reference position of the positioning opening 126 are (x0, y0), and the coordinates of the actual position are (x, y), then the error between the reference position and the actual position may be defined as $(x-x0)^2+(y-y0)^2$. By adjusting the position of the mask 120 relative to the mask frame 110, the error is gradually reduced to below the first threshold, thereby performing the preliminary alignment. Those skilled in the art should understand that the definition of the error between the reference position and the actual position described above is exemplary, and the error may also be defined in other ways according to actual needs.

The step S2 may further include, for example:

Step S40: Provide a reference position of a predetermined display pixel opening of the mask relative to the mask frame;

Step S50: Capture a reference position of the predetermined display pixel opening of the mask relative to the mask frame;

Step S60: Calculate an error between the reference position and the actual position of the predetermined display pixel opening relative to the mask frame to determine whether an alignment of the mask and the mask frame is successful based on the error, and determine that the alignment is successful if the error is below a second threshold, or adjust the actual position of the mask to further perform the alignment if the error is not below the second threshold.

The operation process of step S2 is similar to that of step S1. However, due to the use of finer display pixel opening 125 in the display pattern area 123, the alignment of the same mask 120 and the mask frame 110 may have a higher accuracy. Therefore, the second threshold is less than the first threshold.

Although the precise positioning by using the display pixel opening 125 is illustrated by way of example in the above description, the embodiments of the present disclosure are not limited to this. For example, a dummy pixel opening 125' may be used instead of the display pixel opening 125 for fine positioning. The specific details will not be described here.

The method of manufacturing the mask assembly may further include:

Step S70: Fix the mask to the mask assembly after the precise alignment is performed.

The step S70 may be performed by welding, for example. For the welding process, a component with a greater thickness is more reliable than a component with a smaller thickness. Therefore, a thickness of the fixing area 122 of the mask 120 may be greater than that of the mask pattern area 121. For example, the thickness of the mask pattern area 121 of the mask 120 may be 5 μm to 20 μm, such as 10 μm, and the thickness of the fixing area 122 of the mask 120 may be, for example, 20 μm to 30 μm, such as 25 μm.

Figure 4:
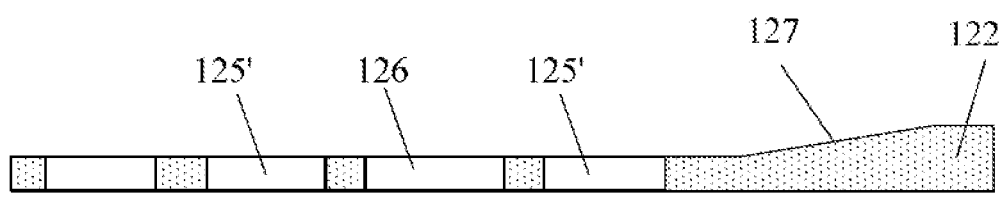
FIG. 4 shows a schematic cross-sectional view taken along line A-A in FIG. 3B.

In addition, in order to prevent a sharp change in the stress between the fixing area 122 and the mask pattern area 121, a thickness transition area 127 may be provided between the fixing area 122 and the mask pattern area 121, as shown in FIG. 4. A width of the thickness transition zone may be 2 to 20 mm, for example.

The mask 120, 120' and the mask assembly 100, 100' of the embodiments of the present disclosure are particularly suitable for the evaporation of the light-emitting material layer of the high-resolution OLED display panel. For example, the largest size of the display pixel opening 125 and dummy pixel opening 125' in the first direction may be, for example, 10 to 25 microns (such as 15 microns), and the largest size thereof in the second direction may be, for example, 25 to 45 microns (such as 35 microns). However, the embodiments of the present disclosure are not limited thereto. The mask 120, 120' and the mask assembly 100, 100' according to the embodiments of the present disclosure may also be used for evaporation of other film layer structures of the OLED display panel.

In the embodiments of the present disclosure, the display pixel opening 125, the dummy pixel opening 125' and the positioning opening 126 of the mask 120, 120' are through holes, which may be manufactured, for example, by laser, chemical liquid etching or electroforming, and the manufacturing precision may be, for example, ±1~1.5 micrometers. In the embodiments of the present disclosure, a material of the mask 120 may be, for example, a nickel-iron alloy, which may contain one or more of elements such as silicon, manganese, titanium, oxygen, carbon, phosphorus, or the like.

The embodiments of the present disclosure further provide a display panel 1000, which has a structure corresponding to the above-mentioned mask 120.

In some embodiments, a plurality of dummy sub-pixel units are provided in the peripheral area 2. FIG. 1B shows two different types of dummy sub-pixel units, which are respectively referred to as a first type of dummy sub-pixel unit 31 and a second type of dummy sub-pixel unit 31' hereinafter. The first type of dummy sub-pixel unit 31 includes a first dummy light-emitting material layer 32, and the second type of dummy sub-pixel unit 31' includes a second dummy light-emitting material layer 32'. The second dummy light-emitting material layer 32' is made of the same material as the first dummy light-emitting material layer 32. For example, both may be made of an organic material that emits red light. A size and shape of an orthographic projection of the second dummy light-emitting material layer 32' on the base substrate 30 (see FIGS. 10 to 1E) are different from those of an orthographic projection of the first dummy light-emitting material layer 32 on the base substrate 30. In the example shown in FIG. 1B, the orthographic projection of the first dummy light-emitting material layer 32 on the base substrate 30 has a hexagonal shape, and the orthographic projection of the second dummy light-emitting material layer 32' on the base substrate 30 has an obround shape. Each of the sizes of the orthographic projection of the second dummy light-emitting material layer 32' on the base substrate 30 in the direction X and direction Y (the direction X and the direction Y are perpendicular to each other) is also greater than that of the orthographic projection of the first dummy light-emitting material layer 32 on the base substrate 30. However, this is only exemplary, and the embodiments of the present disclosure are not limited thereto. It is only required that at least one of the size and shape of the orthographic projection of the second dummy light-emitting material layer 32' on the base substrate 30 is different from that of the orthographic projection of the first dummy light-emitting material layer 32 on the base substrate 30.

In some embodiments, the largest size of the orthographic projection of the second dummy light-emitting material layer 32' on the base substrate 30 in the first direction (for example, the direction X) is greater than that of the orthographic projection of the first dummy light-emitting material layer 32 on the base substrate in the first direction, for example, by 15% to 30%.

In some embodiments, the largest size of the orthographic projection of the second dummy light-emitting material layer 32' on the base substrate 30 in the second direction (for example, the direction Y) perpendicular to the first direction is greater than that of the orthographic projection of the first dummy light-emitting material layer 32 on the base substrate 30 in the second direction, for example, by 15% to 30%.

As mentioned above, the light-emitting material layer (including the above-mentioned first dummy light-emitting material layer and the second dummy light-emitting material layer) of the display panel may be made by evaporation by means of the mask (for example, a fine metal mask (FMM)). In the evaporation process, in order to position the mask and the mask frame more quickly and accurately, the positioning opening 126 may be provided in the peripheral pattern area of the mask. The positioning opening 126 is significantly different from the display pixel opening 125 and the dummy pixel opening 125' in at least one of the shape and size. Correspondingly, in the dummy pixel unit of the display panel, the film layer evaporated with the mask assembly 100, 100' has a corresponding size change at a position corresponding to the positioning opening 126. The second dummy light-emitting material layer 32' in the second type of dummy sub-pixel unit 31' has such a structure. In the display panel, the film layers evaporated by the FMM mainly include a light-emitting material layer and an auxiliary light-emitting layer.

Figure 1C:
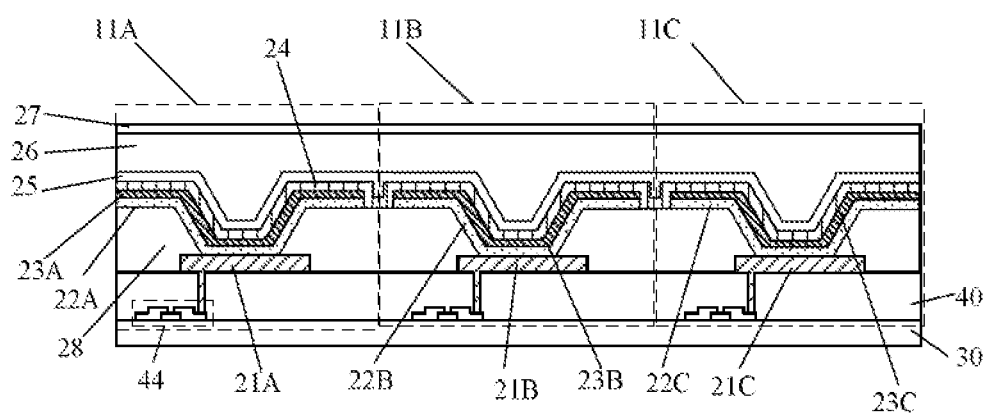

FIG. 1C shows a schematic diagram of the film layer structures of the display sub-pixel units in the display area 1. Three display sub-pixel units are shown. A first display sub-pixel unit 11A has a first electrode 21A (such as an anode), a display auxiliary light-emitting layer 22A located on a side of the first electrode 21A away from the base substrate 30, a display light-emitting material layer 23A located on a side of the display auxiliary light-emitting layer 22A away from the base substrate 30, and a second electrode 24 (such as a cathode) located on a side of the display light-emitting material layer 23A away from the base substrate 30. Similarly, a second display sub-pixel unit 11B has a first electrode 21B (such as an anode), a display auxiliary light-emitting layer 22B located on a side of the first electrode 21B away from the base substrate 30, a display light-emitting material layer 23B located on a side of the display auxiliary light-emitting layer 22B away from the base substrate 30, and a second electrode 24 (such as a cathode) located on a side of the display light-emitting material layer 23B away from the base substrate 30. A third display sub-pixel unit 110 has a first electrode 21C (such as an anode), a display auxiliary light-emitting layer 22C located on a side of the first electrode 21C away from the base substrate 30, a display light-emitting material layer 230 located on a side of the display auxiliary light-emitting layer 22C away from the base substrate 30, and a second electrode 24 (such as a cathode) located on a side of the display light-emitting material layer 23C away from the base substrate 30. A pixel defining layer 28 has an opening area for defining the display light-emitting material layers 23A, 23B and 23C and the display auxiliary light emitting layers 22A, 22B and 22C.

Here, "display light-emitting material layer" and "display auxiliary light-emitting layer" mainly refer to the "light-emitting material layer" and "auxiliary light-emitting layer" in the sub-pixel unit used for image display in the display area, which is distinguished from the "dummy light-emitting material layer" and "dummy auxiliary light-emitting layer" in the dummy pixel unit. Here, "display light-emitting material layer" and "display auxiliary light-emitting layer" in the sub-pixel unit in the display area may participate in light emission during operation, while the "dummy light-emitting material layer" and "dummy auxiliary light-emitting layer" in the dummy pixel unit do not operate.

On a side of the second electrode 24 away from the base substrate 30 is further provided with a packaging structure which may include, for example, a first inorganic packaging layer 25, an organic packaging layer 26 and a second inorganic packaging layer 27 stacked in sequence. An insulating layer 40 and a driving circuit structure such as a thin film transistor 44 may be further provided between the base substrate 30 and the first electrodes 21A, 21B and 21C. Since the content of the present disclosure is mainly related to the evaporation of the light-emitting material layer and the auxiliary light-emitting layer, the insulating layer 40 and the driving circuit structure are not shown and discussed in detail. As an example, the first display sub-pixel unit 11A, the second display sub-pixel unit 11B and the third display sub-pixel unit 11C may respectively represent a display sub-pixel unit of a first color, a display sub-pixel unit of a second color, and a display sub-pixel unit of a third color. These three colors may be red (R), green (G), and blue (B), for example. However, the embodiments of the present disclosure are not limited thereto. For example, the display panel may include display sub-pixel units of only two colors, or display sub-pixel units of four or more colors.

Figure 1D:
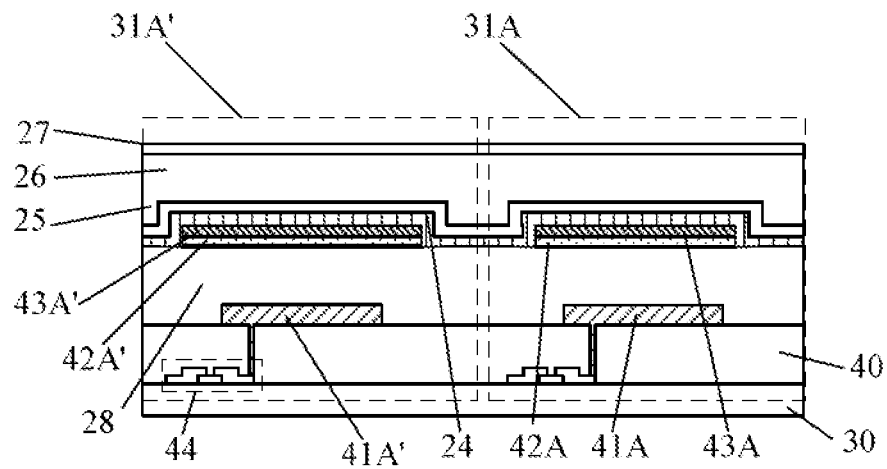
FIG. 1D shows a schematic diagram of a film layer structure of a dummy sub-pixel unit of a first color in the peripheral area of the OLED display panel shown in FIG. 1A.

FIG. 1D shows a schematic cross-sectional view of a first type of dummy sub-pixel unit 31A and a second type of dummy sub-pixel unit 31A'. By comparing with FIG. 1C, it can be seen that in the dummy sub-pixel unit, the pixel defining layer 28 may have no opening area. In the first type of dummy sub-pixel unit 31A, the first electrode 41A' is located on a side of the pixel defining layer 28 facing the base substrate 30, and the first dummy auxiliary light-emitting layer 42A, the first dummy light-emitting material layer 43A and the second electrode 24 are sequentially stacked on the other side of the pixel defining layer 28 away from the base substrate 30. As shown in FIG. 1D, the orthographic projection of the first dummy light-emitting material layer 43A on the base substrate 30 at least partially overlaps the orthographic projection of the first dummy auxiliary light-emitting layer 42A on the base substrate 30. Corresponding to the first type of dummy sub-pixel unit 31A, the second type of dummy sub-pixel unit 31A' also includes a first electrode 41A', a second dummy auxiliary light-emitting layer 42A' located on the side of the pixel defining layer 28 away from the base substrate 30, and a second dummy light-emitting material layer 43A' located on a side of the second dummy auxiliary light-emitting layer 42A' away from the base substrate 30. As shown in FIG. 1D, an orthographic projection of the second dummy light-emitting material layer 43A' on the base substrate 30 at least partially overlaps that of the second dummy auxiliary light-emitting layer 42A' on the base substrate 30. The second dummy auxiliary light-emitting layer 42A' and the first dummy auxiliary light-emitting layer 42A are made of the same material and arranged in the same layer. For example, the second dummy auxiliary light-emitting layer 42A' and the first dummy auxiliary light-emitting layer 42A may correspond to sub-pixel units of the same color. However, a size of the orthographic projection of the second dummy light-emitting material layer 42A' on the base substrate 30 is greater than that of the orthographic projection of the first dummy auxiliary light-emitting layer 42A' on the base substrate 30. For example, in at least one of the first direction and the second direction perpendicular to each other, a largest size of the orthographic projection of the second dummy auxiliary light-emitting layer 42A' on the base substrate 30 is 15% to 30% greater than that of the orthographic projection of the first dummy auxiliary light-emitting layer 42A on the base substrate. However, this is only exemplary, and the embodiments of the present disclosure are not limited thereto. It is only required that at least one of the size and shape of the orthographic projection of the second dummy auxiliary light-emitting layer 42A' on the base substrate 30 is different from that of the orthographic projection of the first dummy auxiliary light-emitting layer 42A on the base substrate 30 so that they may be distinguished easily. In some embodiments, a first structure layer of the first dummy light-emitting material layer 43A and the first dummy auxiliary light-emitting layer 42A (which may be either of the first dummy light-emitting material layer 43A and the first dummy auxiliary light-emitting layer 42A) is arranged in the same layer as a second structure layer of the second dummy light-emitting material layer 43A' and the second dummy auxiliary light-emitting layer 42A' (which may be either of the second dummy light-emitting material layer 43A' and the second dummy auxiliary light-emitting layer 42A'), and at least one of a size and a shape of an orthographic projection of the second structure layer on the base substrate 30 is different from that of an orthographic projection of the first structure layer on the base substrate 30.

In the first type of dummy sub-pixel unit 31A and the second type of dummy sub-pixel unit 31A', the pixel defining layer 28 separates the first electrode 41A, 41A' from the first dummy auxiliary light-emitting layer 42A and the second dummy auxiliary light-emitting layer 42A'. Those skilled in the art should understand that the pixel defining layer 28 in the dummy sub-pixel unit and the pixel defining layer 28 in the pixel area are substantially the same layer. However, the pixel defining layer 28 in the dummy sub-pixel unit has a structure different that in the display area, and it does not have an opening area. Therefore, in the first type of dummy sub-pixel unit 31A and the second type of dummy sub-pixel unit 31A', any light-emitting functional layer is not in contact with the first electrode 41A, 41A'.

Figure 1E:
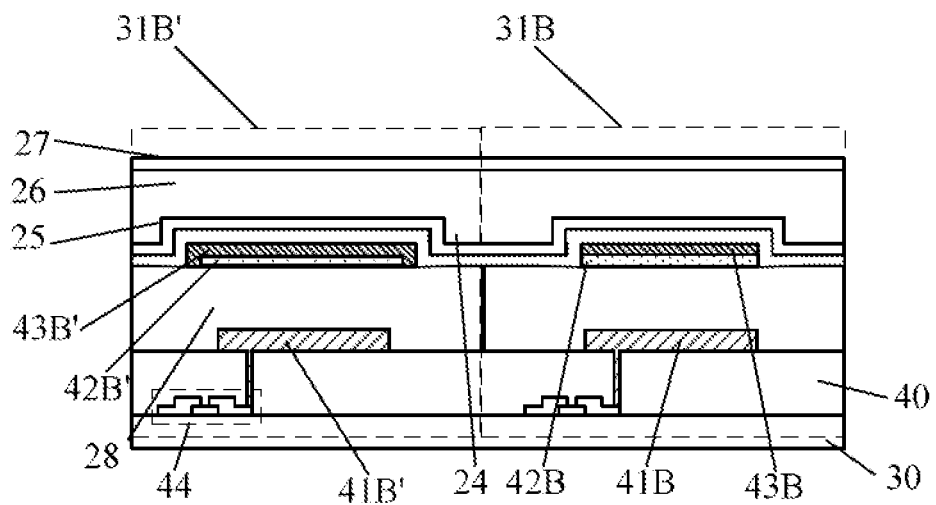
FIG. 1E shows a schematic diagram of a film layer structure of a dummy sub-pixel unit of a second color in the peripheral area of the OLED display panel shown in FIG. 1A.
Figure 1F:
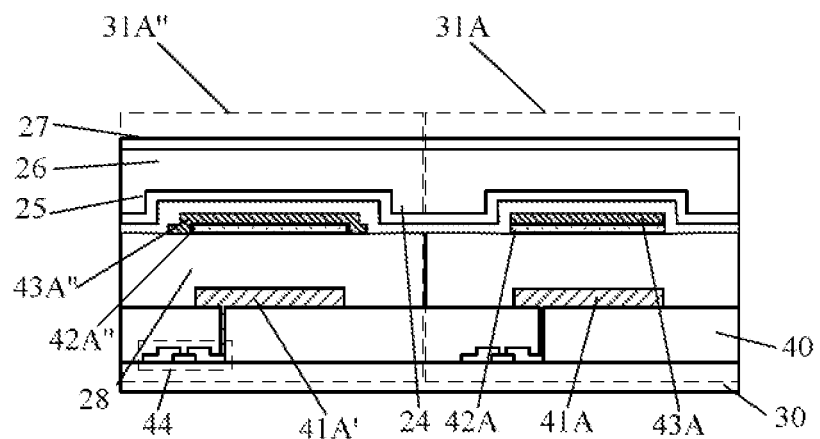
FIG. 1F shows a schematic diagram of a film layer structure of another dummy sub-pixel unit of the first color in the peripheral area of the OLED display panel shown in FIG. 1A.

In some embodiments, when a fine metal mask is used to evaporate the auxiliary light-emitting layer, and another fine metal mask is used to evaporate the light-emitting material layer, the positions of the positioning openings on the two fine metal masks may be located in the same dummy sub-pixel unit, or may not be located in the same dummy sub-pixel unit. In the example shown in FIG. 1D, the largest size of the orthographic projection of the second dummy auxiliary light-emitting layer 42A' on the base substrate 30 is greater than that of the orthographic projection of the first dummy auxiliary light-emitting layer 42A on the base substrate 30, and the largest size of the orthographic projection of the second dummy light-emitting material layer 43A' on the base substrate 30 is also greater than that of the orthographic projection of the first dummy light-emitting material layer 43A on the base substrate 30. Moreover, the largest size of the orthographic projection of the second dummy auxiliary light-emitting layer 42A' on the base substrate 30 is substantially the same as that of the orthographic projection of the second dummy light-emitting material layer 43A' on the base substrate 30. This means that the second type of dummy sub-pixel unit 31A' not only corresponds to the positioning opening of the mask used for evaporation of the first dummy auxiliary light-emitting layer 42A, but also corresponds to the positioning opening of the mask used for evaporation of the first dummy light-emitting material layer 43A. However, in other embodiments, for example, as shown in FIG. 1F, a largest size of an orthographic projection of a second dummy light-emitting material layer 43A" on the base substrate 30 is greater than that of the orthographic projection of the first dummy light-emitting material layer 43A on the base substrate 30, but a largest size of an orthographic projection of a second dummy auxiliary light-emitting layer 42A" on the base substrate 30 is substantially the same as that of the orthographic projection of the first dummy auxiliary light-emitting layer 42A on the base substrate 30. This means that the second type of dummy sub-pixel unit 31A" does not correspond to the positioning opening of the mask used for evaporation of the first dummy auxiliary light-emitting layer 42A, and only corresponds to the positioning opening of the mask used for evaporation of the first dummy light-emitting material layer 43A.

Considering that the display panel may have sub-pixel units of different colors, the dummy sub-pixel units may correspondingly have more types. For example, as shown in FIG. 1E, the plurality of dummy sub-pixel units may further include a third type of dummy sub-pixel unit 31B and a fourth type of dummy sub-pixel unit 31B'. The third type of dummy sub-pixel unit 31B includes a third dummy light-emitting material layer 43B, and the fourth type of dummy sub-pixel unit 31B' includes a fourth dummy light-emitting material layer 43B'. The third dummy light-emitting material layer 43B and the fourth dummy light-emitting material layer 43B' are made of the same material and arranged on the same layer. The material of the third dummy light-emitting material layer 43B and the fourth dummy light-emitting material layer 43B' are different from that of the first dummy light-emitting material layer 43A and the second dummy light-emitting material layer 43A'. That is, the third type of dummy sub-pixel unit 31B and the fourth type of dummy sub-pixel unit 31B' are different from the first type of dummy sub-pixel unit 31A and the second type of dummy sub-pixel unit 31A in the colors of the corresponding sub-pixel units. In the example of FIG. 1E, a size of an orthographic projection of the fourth dummy light-emitting material layer 43B' on the base substrate 30 is significantly greater than that of an orthographic projection of the third dummy light-emitting material layer 43B on the base substrate 30.

In some embodiments, in at least one of the first direction and the second direction, a largest size of the orthographic projection of the fourth dummy light-emitting material layer 43B' on the base substrate 30 is 15% to 30% greater than that of the orthographic projection of the third dummy light-emitting material layer 43B on the base substrate 30, where the second direction is perpendicular to the first direction. However, this is only exemplary, and the embodiments of the present disclosure are not limited thereto. It is only required that at least one of the size and shape of the orthographic projection of the fourth dummy light-emitting material layer 43B' on the base substrate 30 is different from that of the orthographic projection of the third dummy light-emitting material layer 43B on the base substrate 30 so that they may be distinguished easily.

In some embodiments, in at least one of the first direction and the second direction, the size of the orthographic projection of the fourth dummy light-emitting material layer 43B' on the base substrate 30 is different from that of the orthographic projection of the second dummy light-emitting material layer 43A' on the base substrate 30.

In some embodiments, as shown in FIG. 1E, the third type of dummy sub-pixel unit 31B further includes a third dummy auxiliary light-emitting layer 42B located on a side of the third dummy light-emitting material layer 43B facing the base substrate 30 and on a side of the base substrate 30 facing the third dummy light-emitting material layer 43B, and the fourth type of dummy sub-pixel unit 31B' further includes a fourth dummy auxiliary light-emitting layer 42B' located on a side of the fourth dummy light-emitting material layer 43B' facing the base substrate 30 and on a side of the base substrate 30 facing the fourth dummy light-emitting material layer 43B'. The fourth dummy auxiliary light-emitting layer 42B' and the third dummy auxiliary light-emitting layer 42B are made of the same material and arranged in the same layer. As shown in FIG. 1E, the orthographic projection of the third dummy light-emitting material layer 43B on the base substrate 30 at least partially overlaps that of the third dummy auxiliary light-emitting layer 42B on the base substrate 30. The orthographic projection of the fourth dummy light-emitting material layer 43B' on the base substrate 30 at least partially overlaps that of the fourth dummy auxiliary light-emitting layer 42B' on the base substrate 30. A size of the orthographic projection of the fourth dummy auxiliary light-emitting layer 42B' on the base substrate 30 is significantly greater than that of the orthographic projection of the third dummy auxiliary light-emitting layer 42B on the base substrate 30. For example, in at least one of the first direction and the second direction, a largest size of the orthographic projection of the fourth dummy auxiliary light-emitting layer 42B' on the base substrate 30 is 15% to 30% greater than that of the orthographic projection of the third dummy auxiliary light-emitting layer 42B on the substrate 30, where the second direction is perpendicular to the first direction. However, this is only exemplary, and the embodiments of the present disclosure are not limited thereto. It is only required that at least one of the size and shape of the orthographic projection of the fourth dummy auxiliary light-emitting layer 42B' on the base substrate 30 is different from that of the orthographic projection of the third dummy auxiliary light-emitting layer 42B on the base substrate 30 so that they may be distinguished easily.

In some embodiments, the plurality of display sub-pixel units include a display sub-pixel unit of a first color and a display sub-pixel unit of a second color. The display auxiliary light-emitting layer 22A in the display sub-pixel unit of the first color is made of the same material and arranged in the same layer as the second dummy auxiliary light-emitting layer 42A', 42A", and the display light-emitting material layer 23A in the display sub-pixel unit of the first color is made of the same material and arranged in the same layer as the second dummy light-emitting material layer 43A, 43A". the display auxiliary light-emitting layer 22B in the display sub-pixel unit of the second color is made of the same material and arranged in the same layer as the fourth dummy auxiliary light-emitting layer 42B', and the display light-emitting material layer 23B in the display sub-pixel unit of the second color is made of the same material and arranged in the same layer as the fourth dummy light-emitting material layer 43B'.

In some embodiments, the orthographic projection of at least one of the second dummy light-emitting material layer 43A', 43A", the second dummy auxiliary light-emitting layer 42A', 42A", the fourth dummy light-emitting layer 43B' and the fourth dummy auxiliary light-emitting layers 42B' on the base substrate has an axisymmetric shape.

The above descriptions are only preferred embodiments of the present disclosure and explanations of the technical principles applied. Those skilled in the art should understand that the scope of the invention involved in the present disclosure is not limited to the technical solutions formed by the specific combination of the above technical features, and should also cover other technical solutions formed by any combination of the above technical features or their equivalent features without departing from the inventive concept, for example, the technical features formed by mutual replacements of the above-mentioned features and the technical features with similar functions disclosed (but not limited thereto) in the present disclosure.

The invention claimed is:

1. A display panel, comprising:
   a base substrate; and
   a display area and a peripheral area arranged on the base substrate, the peripheral area being arranged around the display area;
   wherein the peripheral area is provided with a plurality of dummy sub-pixel units comprising a plurality of first type of dummy sub-pixel units and at least one second type of dummy sub-pixel unit, each of the plurality of first type of dummy sub-pixel units comprises a first dummy light-emitting material layer and a first dummy auxiliary light-emitting layer, each of the at least one second type of dummy sub-pixel unit comprises a second dummy light-emitting material layer and a second dummy auxiliary light-emitting layer, the second dummy light-emitting material layer is made of the same material and arranged in the same layer as the first dummy light-emitting material layer, and the second dummy auxiliary light-emitting layer is made of the same material and arranged in the same layer as the first dummy auxiliary light-emitting layer; the first dummy auxiliary light-emitting layer is located on a side of the first dummy light-emitting material layer facing the base substrate and on a side of the base substrate facing the first dummy light-emitting material layer, and the second dummy auxiliary light-emitting layer is located on a side of the second dummy light-emitting material layer facing the base substrate and on a side of the base substrate facing the second dummy light-emitting material layer; an orthographic projection of the first dummy light-emitting material layer on the base substrate at least partially overlaps an orthographic projection of the first dummy auxiliary light-emitting layer on the base substrate, and an orthographic projection of the second dummy light-emitting material layer on the base substrate at least partially overlaps an orthographic projection of the second dummy auxiliary light-emitting layer on the base substrate;
   wherein; at least one of a size and a shape of the orthographic projection of the second dummy light-emitting material layer on the base substrate is different from that of the orthographic projection of the first dummy light-emitting material layer on the base substrate, and at least one of a size and a shape of the orthographic projection of the second dummy auxiliary light-emitting layer on the base substrate is different from that of the orthographic projection of the first dummy auxiliary light-emitting layer on the base substrate; and
   wherein each of the at least one second type of dummy sub-pixel unit is surrounded by first type of dummy sub-pixel units among the plurality of first type of dummy sub-pixel units.

2. The display panel according to claim 1, wherein, in at least one of a first direction and a second direction perpendicular to the first direction, a largest size of any one of the orthographic projection of the second dummy light-emitting material layer on the base substrate and the orthographic projection of the second dummy auxiliary light-emitting layer on the base substrate is 15% to 30% greater than a largest size of one of the -orthographic projection of the first dummy light-emitting material layer on the base substrate and the orthographic projection of the first dummy auxiliary light-emitting layer on the base substrate that is arranged in the same layer as the any one of the orthographic projection of the second dummy light-emitting material layer on the base substrate and the orthographic projection of the second dummy auxiliary light-emitting layer on the base substrate.

3. The display panel according to claim 1, wherein the plurality of dummy sub-pixel units further comprise a third type of dummy sub-pixel unit comprising a third dummy light-emitting material layer and a fourth type of dummy sub-pixel unit comprising a fourth dummy light-emitting material layer, and the third dummy light-emitting material layer and the fourth dummy light-emitting material layer are made of the same material which is different from the material of the first dummy light-emitting material layer and the second dummy light-emitting material layer; and
   wherein at least one of a size and a shape of an orthographic projection of the fourth dummy light-emitting material layer on the base substrate is different from that of an orthographic projection of the third dummy light-emitting material layer on the base substrate.

4. The display panel according to claim 3, wherein, in at least one of a first direction and a second direction perpendicular to the first direction, a largest size of the orthographic projection of the fourth dummy light-emitting material layer on the base substrate is 15% to 30% greater than that of the orthographic projection of the third dummy light-emitting material layer on the base substrate; or the size of the orthographic projection of the fourth dummy light-emitting material layer on the base substrate is different from that of the orthographic projection of the second dummy light-emitting material layer on the base substrate.

5. The display panel according to claim 3, wherein, the third type of dummy sub-pixel unit further comprises a third dummy auxiliary light-emitting layer located on a side of the third dummy light-emitting material facing the base substrate and on a side of the base substrate facing the third dummy light-emitting material layer, and the fourth type of dummy sub-pixel unit further comprises a fourth dummy auxiliary light-emitting layer located on a side of the fourth dummy light-emitting material layer facing the base substrate and on a side of the base substrate facing the fourth dummy light-emitting material layer; the fourth dummy auxiliary light-emitting layer is made of the same material as the third dummy auxiliary light-emitting layer; and at least one of a size and a shape of an orthographic projection of the fourth dummy auxiliary light-emitting layer on the base substrate is different from that of an orthographic projection of the third dummy auxiliary light-emitting layer on the base substrate.

6. The display panel according to claim 5, wherein, in at least one of a first direction and a second direction, a largest size of the orthographic projection of the fourth dummy auxiliary light-emitting layer on the base substrate is 15% to 30% greater than that of the orthographic projection of the third dummy auxiliary light-emitting layer on the base substrate, the second direction is perpendicular to the first direction.

7. The display panel according to claim 5, wherein the display area comprises a plurality of display sub-pixel units, at least one of the display sub-pixel units comprising:
a first electrode, a display auxiliary light-emitting layer located on a side of the first electrode away from the base substrate, a display light-emitting material layer located on a side of the display auxiliary light-emitting layer away from the base substrate, and a second electrode located on a side of the display light-emitting material layer away from the base substrate, wherein, the plurality of display sub-pixel units comprise a display sub-pixel unit of a first color and a display sub-pixel unit of a second color, the display auxiliary light-emitting layer in the display sub-pixel unit of the first color is made of the same material and arranged in the same layer as the second dummy auxiliary light-emitting layer, and the display light-emitting material layer in the display sub-pixel unit of the first color is made of the same material and arranged in the same layer as the second dummy light-emitting material layer; the display auxiliary light-emitting layer in the display sub-pixel unit of the second color is made of the same material and arranged in the same layer as the fourth dummy auxiliary light-emitting layer, and the display light-emitting material layer in the display sub-pixel unit of the second color is made of the same material and arranged in the same layer as the fourth dummy light-emitting material layer.

8. The display panel according to claim 5, wherein an orthographic projection of at least one of the second dummy light-emitting material layer, the second dummy auxiliary light-emitting layer, the fourth dummy light-emitting material layer and the fourth dummy auxiliary light-emitting layer on the base substrate has an axisymmetric shape.

9. The display panel according to claim 1, wherein at least one of the first type of dummy sub-pixel unit and the second type of dummy sub-pixel unit further comprises:
a first electrode located on a side of the base substrate facing the first dummy auxiliary light-emitting layer and the second dummy auxiliary light-emitting layer;
a pixel defining layer located on a side of the first electrode away from the base substrate and on a side of the first dummy auxiliary light-emitting layer and the second dummy auxiliary light-emitting layer facing the base substrate; and
a second electrode located on a side of the first dummy light-emitting material layer and the second dummy light-emitting material layer away from the base substrate, wherein, the pixel defining layer separates the first electrode from the first dummy auxiliary light-emitting layer and the second dummy auxiliary light-emitting layer.

\* \* \* \* \*